(12) United States Patent
Sluiter (10) Patent No.: US 7,924,178 B2
(45) Date of Patent: Apr. 12, 2011

(54) SYSTEM AND METHOD FOR LOSSLESS DATA COMPRESSION

(75) Inventor: David Orrin Sluiter, Superior, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 156 days.

(21) Appl. No.: 12/243,687

(22) Filed: Oct. 1, 2008

(65) Prior Publication Data

US 2010/0079311 A1   Apr. 1, 2010

(51) Int. Cl.
    *H03M 7/34* (2006.01)
(52) U.S. Cl. ..................... 341/51; 375/240.01
(58) Field of Classification Search ............ 341/51; 375/240.01, 240.23, 240.26; 707/2, 104.1; 711/100, 216

See application file for complete search history.

(56) References Cited

U.S. PATENT DOCUMENTS

| | | | |
|---|---|---|---|
| 5,757,900 A * | 5/1998 | Nagel et al. ............. | 379/221.09 |
| 7,016,408 B2 * | 3/2006 | Heath ...................... | 375/240.01 |
| 2006/0106870 A1 * | 5/2006 | Franaszek et al. ......... | 707/104.1 |
| 2007/0247350 A1 * | 10/2007 | Ryan ............................ | 342/65 |

* cited by examiner

*Primary Examiner* — Joseph Lauture
(74) *Attorney, Agent, or Firm* — David K. Lucente (57) ABSTRACT

An embodiment of a method for compressing data includes variable length coding one or more values of control codes generated from dictionary coding the data, wherein the control codes comprise literals and indices, wherein each index comprises a length value and a pointer to previously read in data. An embodiment of a system for losslessly compressing input data includes a modeler operable to determine whether a set of input data matches prior input data, an encoder operable to generate control codes including one or more literal control codes and one or more index control codes, wherein each index control code includes a pointer to a location in the input data and a length value indicating a number of bytes to copy from the location, and wherein the length value is variable length coded.

19 Claims, 8 Drawing Sheets

Elias Delta Code Table 400

Symbol = 077 : 00111001100, bit_count = 11
Symbol = 078 : 00111001101, bit_count = 11
Symbol = 079 : 00111001110, bit_count = 11
Symbol = 080 : 00111001111, bit_count = 11
Symbol = 081 : 00111010000, bit_count = 11

Symbol = 126 : 00111111101, bit_count = 11
Symbol = 127 : 00111111110, bit_count = 11
Symbol = 128 : 00111111111, bit_count = 11
Symbol = 129 : 000100000000000, bit_count = 14
Symbol = 130 : 000100000000001, bit_count = 14
Symbol = 131 : 000100000000010, bit_count = 14
Symbol = 132 : 000100000000011, bit_count = 14

Symbol = 254 : 000100001111101, bit_count = 14
Symbol = 255 : 000100001111110, bit_count = 14
Symbol = 256 : 000100001111111, bit_count = 14
Symbol = 257 : 0001000100000000, bit_count = 15
Symbol = 258 : 0001000100000001, bit_count = 15
Symbol = 259 : 0001000100000010, bit_count = 15

SYSTEM AND METHOD FOR LOSSLESS DATA COMPRESSION

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

An embodiment of a method for compressing data includes variable length coding one or more values of control codes generated from dictionary coding the data, wherein the control codes comprise literals and indices, wherein each index comprises a length value and a pointer to previously read in data. The method may further include dictionary coding the data to generate the control codes. Dictionary coding the data may include applying a Lempel-Ziv 77 (LZ77) algorithm to the data In accordance with an embodiment of the method, variable length coding one or more values of a control code may include variable length coding only the length value of the control code. Variable length coding may include substituting Elias Delta codes for length values of the control codes. The method may farther include inserting a type code to the control codes, wherein the type code indicates whether the control code is a literal or an index.

According to at least one embodiment, dictionary coding the data may include reading in a specified number of symbols, determining if the symbols match a prior received set of data, and if the symbols match a prior received set of data, substituting a pointer and a length value for the symbols, wherein the pointer refers to a location of the prior received set of data and the length value indicates a length of matching data. The method may further include speculatively string matching the symbols. Speculatively string matching may include determining that an input symbol from among the read in symbols does not continue a current string match with respect to the prior received data, determining that at least the input symbol from among the read in symbols matches at least one other value in the prior received data, and continuing string matching with the next read in symbol.

An embodiment of a system for losslessly compressing input data includes a modeler operable to determine whether a set of input data matches prior input data, an encoder operable to generate control codes including one or more literal control codes and one or more index control codes, wherein each index control code includes a pointer to a location in the input data and a length value indicating a number of bytes to copy from the location, and wherein the length value is variable length coded. The modeler may include a content addressable memory receiving current input data, and a running string memory comprising prior input data, wherein the current input data of the CAM is compared to the prior input data of the running string memory. The modeler may further include AND modules in operable communication with memory locations of the CAM and the running string memory, wherein the AND modules provide comparison between memory locations of the CAM and the running string memory. The encoder may variable length code the length values using Elias Delta codes. The system may further include a match counter operable to generate a matching string length.

An embodiment of a disc drive includes a data compression system configured to dictionary code data to generate control codes comprising literal control codes and index control codes, wherein each index control code comprises a length value and a pointer, and wherein the data compression system is further configured to variable length code the length values of the index control codes. The data compression system may include a modeler configured to compare current input data to previous input data, an encoder configured to generate the control codes, wherein the encoder generates an index control code when a string of current input matches a string of previous input data, and wherein the encoder variable length codes length values of the index control codes. The data compression system may further include a match counter generating the length values when a matching string is detected.

BRIEF DESCRIPTION OF THE DRAWINGS

The described technology is best understood from the following Detailed Description describing various implementations read in connection with the accompanying drawings.

DETAILED DESCRIPTIONS

An embodiment of a lossless data compression system employs dictionary coding, variable length coding and tokenization of an input stream of symbols. A sequence of one or more symbols is referred to as a string. Dictionary coding involves searching in prior input data for a current string of symbols and, if found, substituting the current string of symbols with a reference to the prior occurrence. During dictionary coding, strings of symbols of the input stream are read and compared to prior received symbols to identify repeated sequences of symbols. A first occurrence of a string is stored in a history buffer. Later occurrences of the string are replaced with a token that references the prior stored string. At least a portion of the tokenized output is variable length encoded such that more frequently occurring tokens are represented by fewer bits.

Embodiments can process input data to generate compressed output data. The input data may be of varying sizes in different embodiments. For example, an embodiment may compress one byte (8 bits), two bytes (16 bits) or four bytes (32 bits) at a time. Further, a system may be operable to compress in multiple modes. For example, a particular embodiment may operate in an 8 bit mode or a 32 bit mode. The mode may be selectable. Output data may be in the form of a compressed data unit or a literal. A literal is typically generated when the input data cannot be compressed to a smaller bit count. A compressed data unit typically includes a length value and a pointer value. The pointer value may be variable length coded.

In accordance with various embodiments, the compression system is implemented in hardware, such as, but not limited to one or more application specific integrated circuits (ASIC), digital signal processors, programmable logic arrays, microprocessors, or the like, or any combination thereof. In some embodiments, compression is carried out in real-time. In such embodiments compression of a unit of input data (e.g., a symbol; 1 or more bytes) is performed in one clock cycle. Of course, the frequency of the clock may vary depending on the particular limitation. Example clock frequencies include 50 MHz up to 300 MHz frequencies or higher.

As discussed further below, some embodiments of the lossless data compression system provide for 8-bit and 32-bit history buffer comparisons. Embodiments may also provide for expansion mitigation for 16-bit or 32-bit history buffer comparisons, speculative string match starting and string match output tokens that utilize variable length coding of string lengths. Speculative string match starting refers to assuming that an input symbol is the start of a new string match when the input symbol does not continue a current string match but the input symbol does match another history buffer location. Thus, using speculative string match starting, instead of outputting a non-matching symbol as a literal, the symbol is saved as the start of another matching string.

Figure 1:
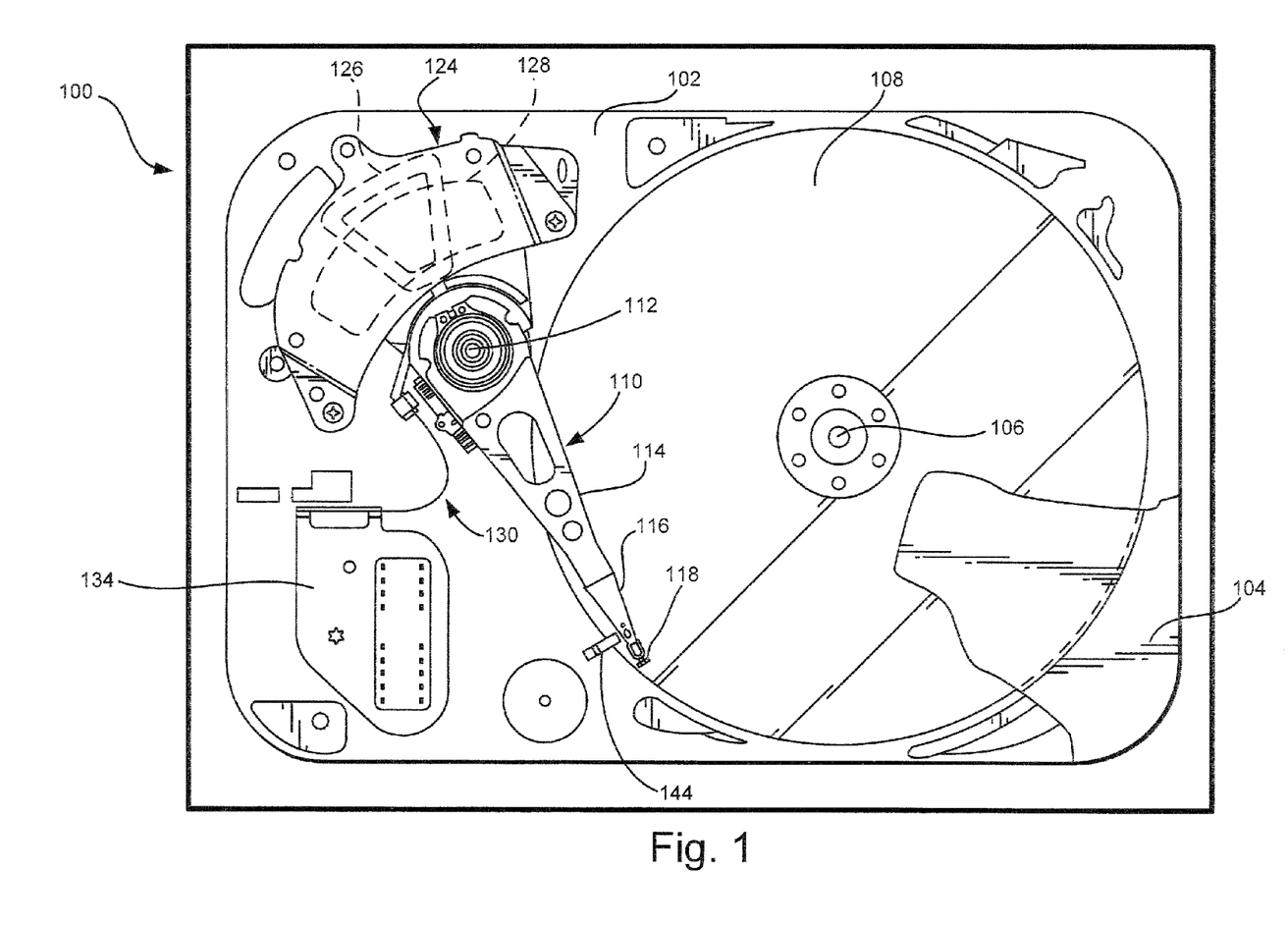
FIG. 1 illustrates a plan view of an example disc drive.

One device that may implement lossless data compression and decompression exemplified herein is a hard disc drive 100. FIG. 1 illustrates a plan view of an example disc drive 100. The disc drive 100 includes a base 102 to which various components of the disc drive 100 are mounted. A top cover 104, shown partially cut away, cooperates with the base 102 to form an internal, sealed environment for the disc drive in a conventional manner. The components include a spindle motor 106 that rotates one or more storage medium discs 108 at a constant high speed. Information is written to and read from tracks on the discs 108 through the use of an actuator assembly 110, which rotates during a seek operation about a bearing shaft assembly 112 positioned adjacent the discs 108. The actuator assembly 110 includes a plurality of actuator arms 114 that extend towards the discs 108, with one or more flexures 116 extending from each of the actuator arms 114. Mounted at the distal end of each of the flexures 116 is a head 118 that includes an air bearing slider enabling the head 118 to fly in close proximity above the corresponding surface of the associated disc 108. The distance between the head 118 and the storage media surface during flight is referred to as the "fly height".

During a seek operation, the track position of the head 118 is controlled through the use of a voice coil motor (VCM) 124, which typically includes a coil 126 attached to the actuator assembly 110, as well as one or more permanent magnets 128 which establish a magnetic field in which the coil 126 is immersed. The controlled application of current to the coil 126 causes magnetic interaction between the permanent magnets 128 and the coil 126 so that the coil 126 moves in accordance with the well-known Lorentz relationship. As the coil 126 moves, the actuator assembly 110 pivots about the bearing shaft assembly 112, and the heads 118 are caused to move across the surfaces of the discs 108.

The spindle motor 106 is typically de-energized when the disc drive 100 is not in use for extended periods of time. The heads 118 are moved away from portions of the disk 108 containing data when the drive motor is de-energized. The heads 118 are secured over portions of the disk not containing data through the use of an actuator latch arrangement and/or ramp assembly 144, which prevents inadvertent rotation of the actuator assembly 110 when the drive discs 108 are not spinning.

A flex assembly 130 provides the requisite electrical connection paths for the actuator assembly 110 while allowing pivotal movement of the actuator assembly 110 during operation. The flex assembly 130 includes a printed circuit board 134 to which a flex cable connected with the actuator assembly 110 and leading to the head 118 is connected. The flex cable may be routed along the actuator arms 114 and the flexures 116 to the heads 118. The printed circuit board 134 typically includes circuitry for controlling the write currents applied to the heads 118 during a write operation and a preamplifier for amplifying read signals generated by the heads 110 during a read operation. The flex assembly 130 terminates at a flex bracket for communication through the base deck 102 to a disc drive printed circuit board (not shown) mounted to the bottom side of the disc drive 100.

Figure 2:
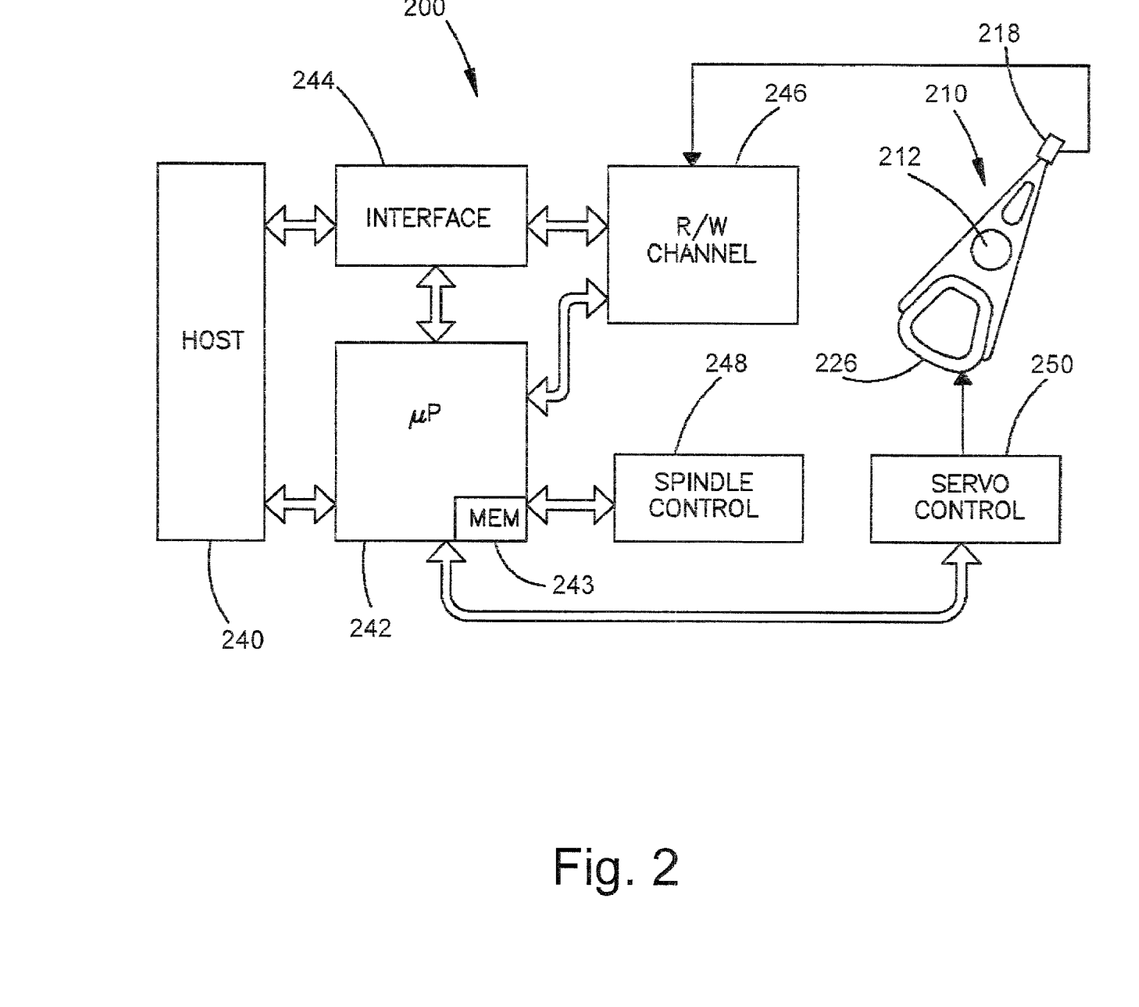
FIG. 2 illustrates the example functional components of a disc drive.

FIG. 2 illustrates the primary functional components of a disc drive incorporating one of the various implementations of the described technology and generally shows the main functional circuits that are resident on the disc drive printed circuit board and used to control the operation of the disc drive. The disc drive is operably connected to a host computer 240 in a conventional manner. Control communication paths are provided between the host computer 240 and a disc drive microprocessor 242, the microprocessor 242 generally providing top level communication and control for the disc drive in conjunction with programming for the microprocessor 242 stored in microprocessor memory (MEM) 243. The MEM 243 can include random access memory (RAM), read only memory (ROM) and other sources of resident memory for the microprocessor 242.

The discs are rotated at a constant high speed by a spindle motor control circuit 248, which typically electrically commutates the spindle motor through the use, typically, of back electromotive force (BEMF) sensing. During a seek operation, wherein an actuator 210 moves heads 218 between tracks on the storage media, the position of the heads 218 is controlled through the application of current to the coil 226 of a voice coil motor. A servo control circuit 250 provides such control. During a seek operation the microprocessor 242 receives information regarding the velocity of the head 218, and uses that information in conjunction with a velocity profile stored in memory 243 to communicate with the servo control circuit 250, which will apply a controlled amount of current to the voice coil motor coil 226, thereby causing the actuator assembly 210 to be pivoted.

Data is transferred between the host computer 240 or other device and the disc drive by way of an interface 244, which typically includes a buffer to facilitate high speed data transfer between the host computer 240 or other device and the disc drive. Data to be written to the disc drive is thus passed from the host computer 240 to the interface 244 and then to a read/write channel 246, which encodes and serializes the data and provides the requisite write current signals to the heads 218. To retrieve data that has been previously stored in the data storage device, read signals are generated by the heads 218 and provided to the read/write channel 246, which performs decoding and error detection and correction operations and outputs the retrieved data to the interface 244 for subsequent transfer to the host computer 240 or other device.

Figure 3:
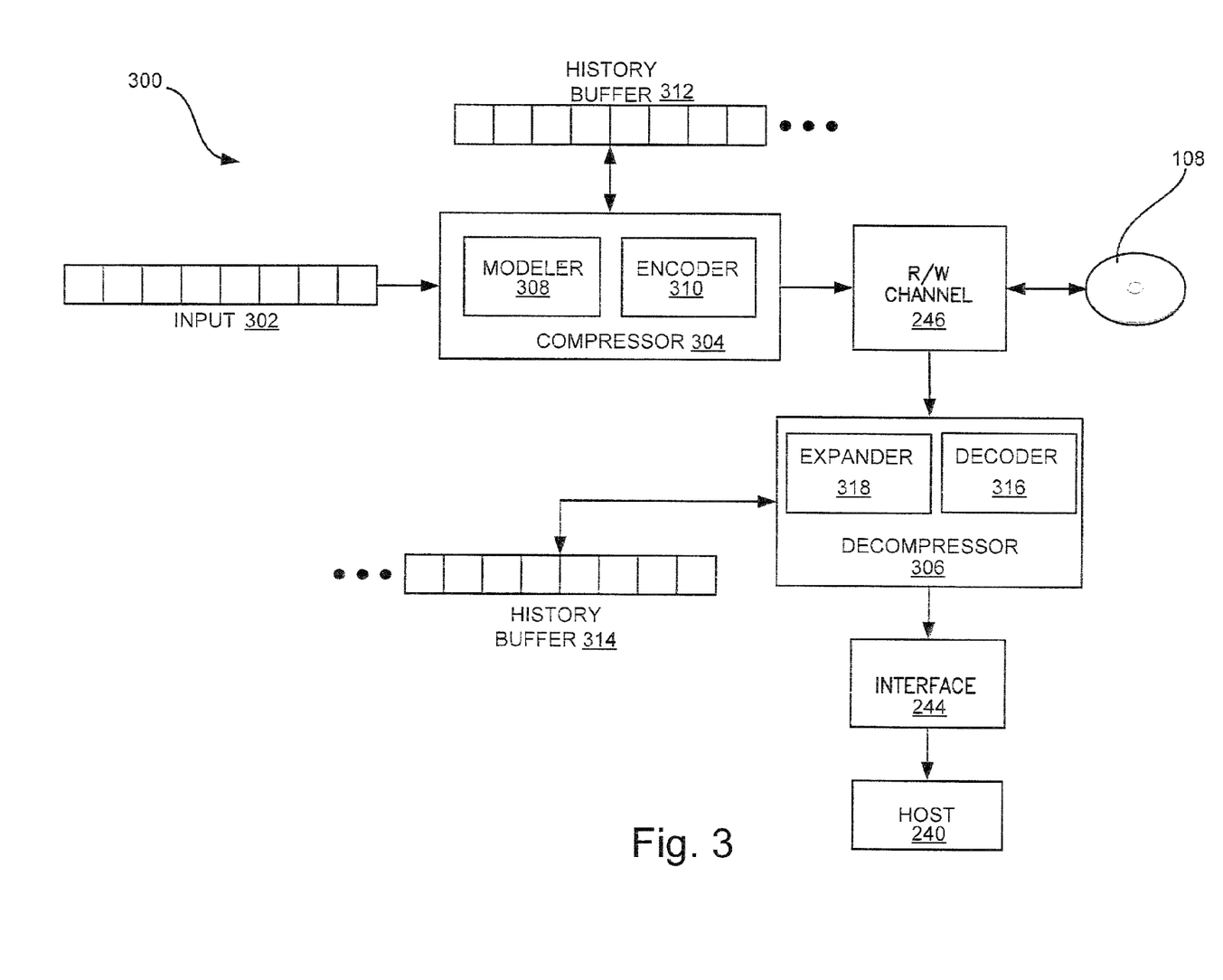
FIG. 3 is a functional module diagram illustrating functional components in a lossless data compression system according to one embodiment.

FIG. 3 is a functional block diagram illustrating functional components in a lossless data compression system 300. The lossless data compression system 300 may be implemented using the microprocessor 242 of FIG. 2 or other hardware elements. One or more features of the system 300 could also be implemented in software.

An input data unit 302 is input to a compressor 304, which generates output data that is sent to the R/W channel 246 and stored on the disc 108. When data is read from the disc 108, the data is communicated to a decompressor 306, which decompresses the data to its original form. In the illustrated embodiment, decompressor 306 includes a decoder 316 and an expander 318. Decoder 316 performs variable length decoding of length portions of coded data. The expander 318 generates the initial input data without loss by expanding control codes into the original form of the input data.

Expander 318 uses history buffer 314 to track the history of decompressed symbols to use during decoding of the compressed tokens. As data is read from the disc 108 it is placed in the history buffer 314. A control code may reference a location and length of a set of data in the history buffer. The expander 318 copies the referenced data into the decompressed data for output. The control code may contain the literal value and be output directly. The decompressed data is sent to the interface 244 and on to the host 240.

In the illustrated embodiment, the compressor 304 includes a modeler 308 and an encoder 310. The modeler 308 analyzes a stream of input data to identify matching streams of data. Input data that matches prior received input data can be replaced in the output with a pointer and length value to refer to the earlier received input data. The modeler 308 utilizes a history buffer 312 to perform the analysis. The history buffer 312 includes a specified number of input symbols and allows for a "sliding window" check across the history of symbols to determine whether an input data unit matches prior received input.

The encoder 310 receives the output from the modeler 308 and determines an index, which includes a pointer or reference value and a length. The pointer refers to a prior location in the history buffer 312 and the length refers to the number of symbols to include from that location. If an input data symbol cannot be matched to a prior input, or encoding the input to an index would yield an undesirable compression ratio, the input data is encoded to a literal.

Figure 4:
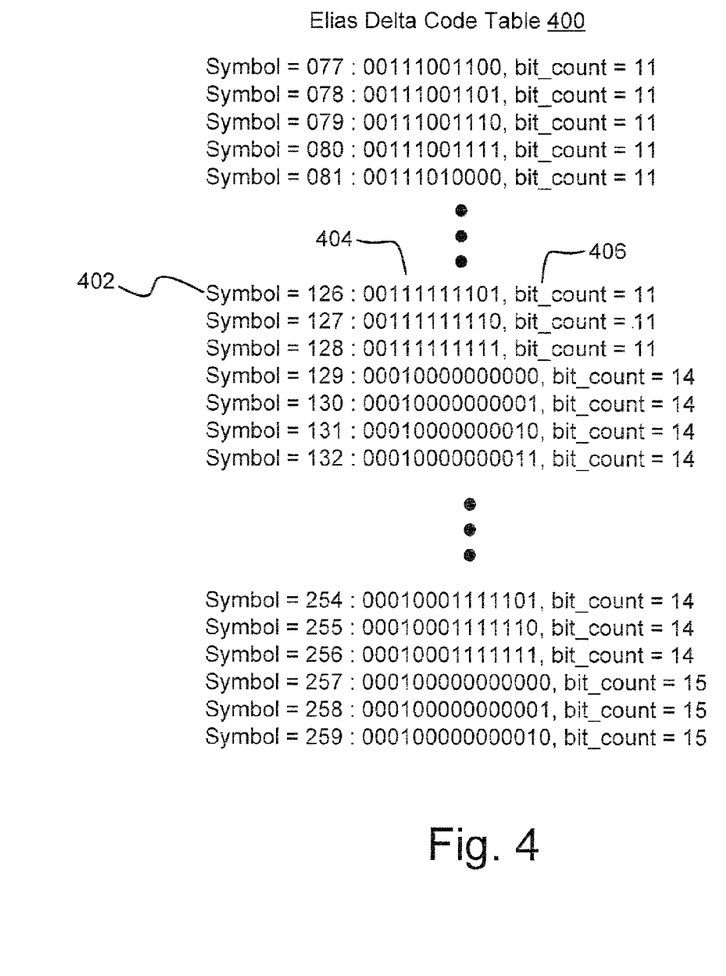
FIG. 4 illustrates an example table of Elias Delta Codes that can be used for variable length coding length portions of control codes generated by the lossless data compression system.

The encoder 310 further encodes the length value of the index token using variable length coding. In one embodiment, the encoder uses Elias Delta codes to encode the length values in such a way that more common length values are encoded into fewer numbers of bits than less common length values. An example of a set of Elias Delta codes is shown in Elias Delta code Table 400 of FIG. 4. In FIG. 4, the symbols 402 in the left column represent length values, the bit codes 404 in the middle column represent bit combinations that are substituted for the associated symbols 402 and the bit counts 406 are the number of bits in the associated bit codes 404.

Other types of variable length coding can be used, such as, but not limited to, Huffman coding. As discussed further below, the encoder 310 tokenizes the output symbols and inserts a type code that indicates whether the output token is a literal or an index.

Figure 5:
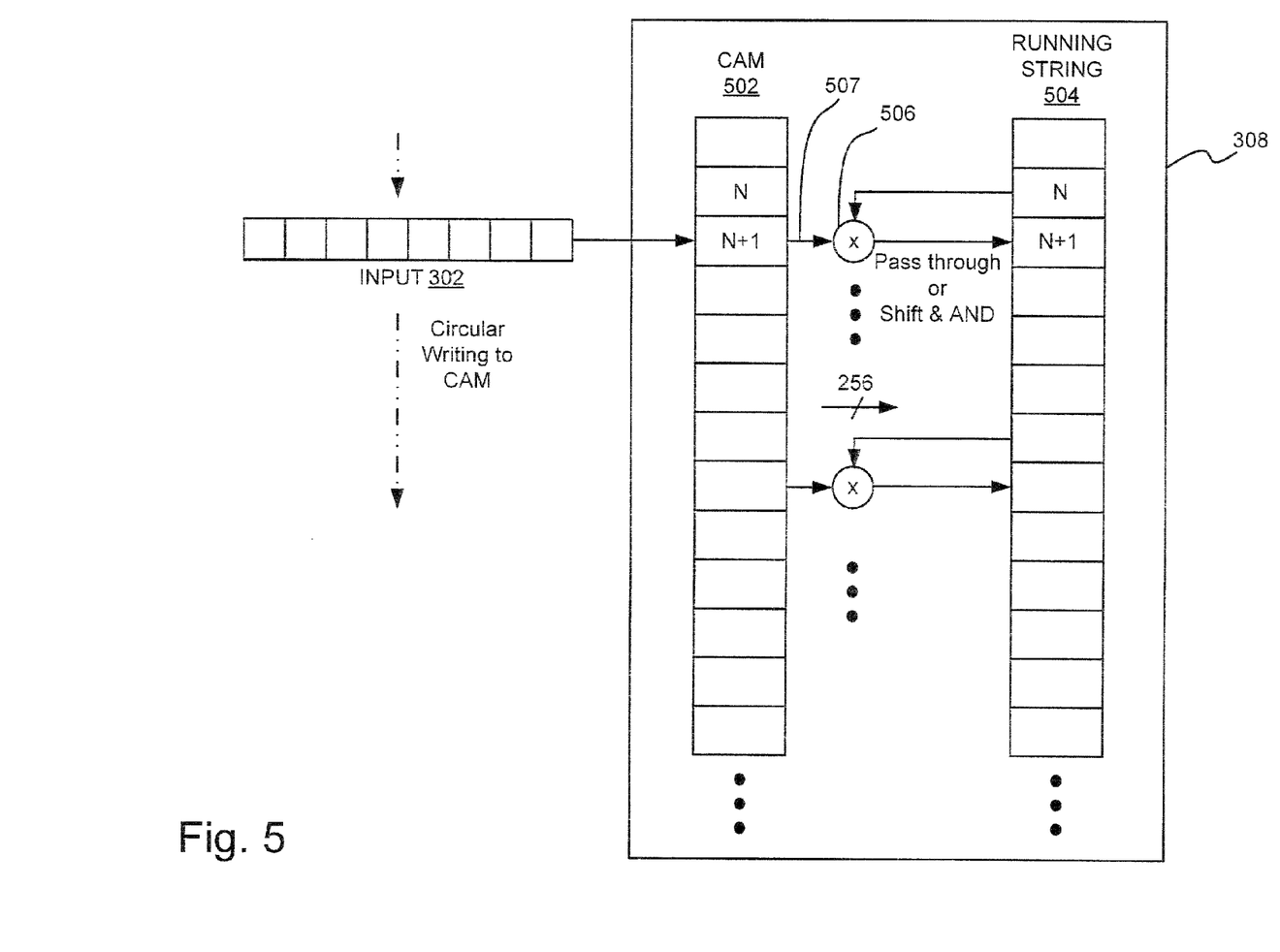
FIG. 5 illustrates components of an example modeler that may be used in a lossless data compression system according to one embodiment.

FIG. 5 illustrates a modeler 308 that may be included in an embodiment of a lossless data compression system, such as compressor 304. The modeler 308 includes a content addressable memory (CAM) 502 that receives input 302. CAM 502 can be of a predetermined depth, such as, but not limited to, 256 locations. Input 302 is written to CAM 502 in a circular fashion, so that after the last memory location of the CAM 502 is written to, the next input 302 is written to the first memory location of the CAM 502. As such, old data in the CAM 502 is written over cyclically.

The modeler 302 also includes a running string memory 504. Initially the running string memory 504 is cleared. When one or more CAM 502 matches are found, the running string is loaded with the initial match value 507. As subsequent input symbols are compared against the CAM 502 contents, the running string memory is compared against the CAM 502 match value 507.

In some embodiments, the comparison between data in the CAM 502 and the data in the running string memory 504 is made using "AND" modules 506. A bit (N) in the running string memory 504 is ANDed with the next bit (N+1) in the match value 507. The result of the AND is stored in running string memory 504 in bit N+1. It is through this ANDing and shifting operation that an initial CAM 502 match in the running string memory 504 is propagated along for each new input symbol that continues the string.

Figure 6:
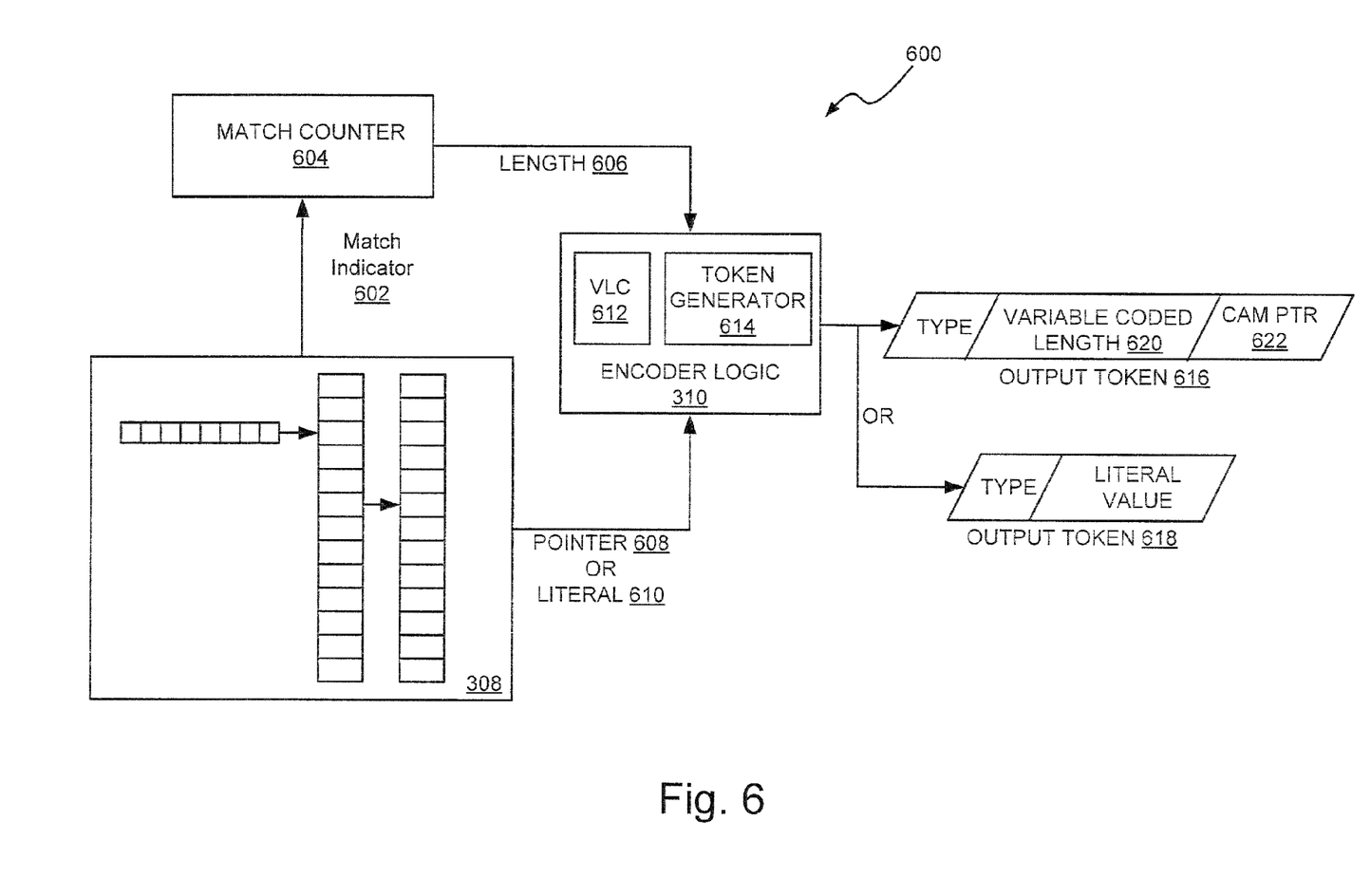
FIG. 6 is a functional module diagram illustrating functional components in a lossless data compression system according to one embodiment.

FIG. 6 illustrates components of a lossless data compression system 600 in accordance with one embodiment. In this embodiment, the modeler 308 outputs a match indicator 602 whenever input bits match a prior set of received symbols within the sliding window history. A match counter 604 counts the number of matches and generates a length value 606. The modeler 308 outputs a pointer 608 that references the location in the history window where the match first occurred. If there is no match, length value 606 is set to zero and the modeler 308 outputs the literal value 610 instead of a pointer 608.

Encoder logic 310 receives the length value 606 and the pointer 608 or literal 610. A variable length coder 612 variable length codes the length value 606. A token generator 614 combines the encoded length data and pointer or literal, along with a type code to generate output tokens. In one embodiment, type code is set to "1" for a literal and "0" for an index. The encoder 310 can output an index output token 616 or a literal output token 618. Index output token 616 includes variable length coded length value 620 and CAM pointer 622.

Generally, the data compression process includes dictionary coding of input data and variable length coding at least a portion of the output token. Dictionary coding involves searching prior input data for current input strings and generating control codes that specify the current input strings either literally or by reference. Example control codes are output tokens 616 and output tokens 618. Thus, control codes can include literal control codes and index control codes. CAM pointer 622 may be referred to as a copy control code, indicating a location in a CAM or history buffer from which to begin copying data during the decompression step.

Figure 7:
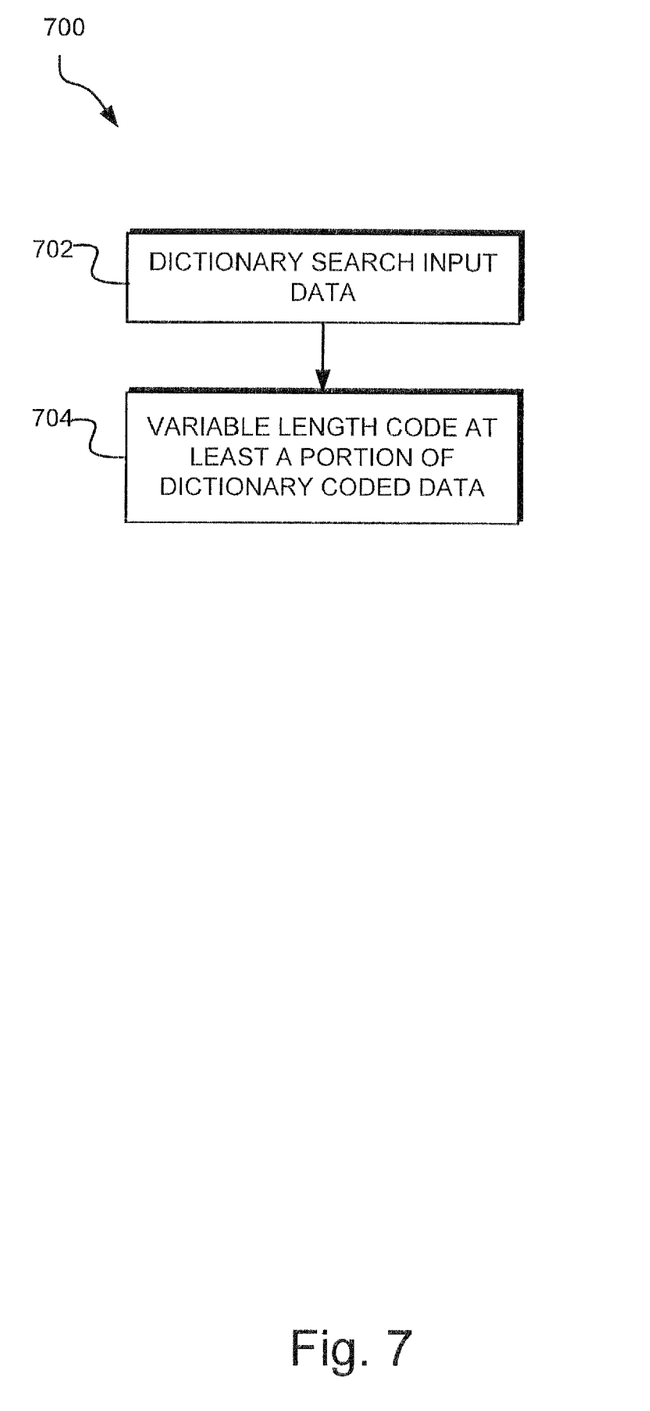
FIGS. 7-8 are flow diagrams illustrating implementations of methods of lossless data compression according to one embodiment.

FIG. 7 is a flowchart illustrating a generalized lossless data compression algorithm 700 according to an embodiment of the invention. Generally, a dictionary coding operation 702 searches previously received data for a current string of data and codes the current string of data either literally or by reference to a prior occurrence of the string. Dictionary coding may involve applying a compression algorithm such as, but not limited to, LZ77 and/or LZSS. Control codes are generated in the dictionary coding operation 702. A variable length coding operation 704 variable length codes at least a portion of one or more of the control codes from the dictionary coding operation 702.

Figure 8:
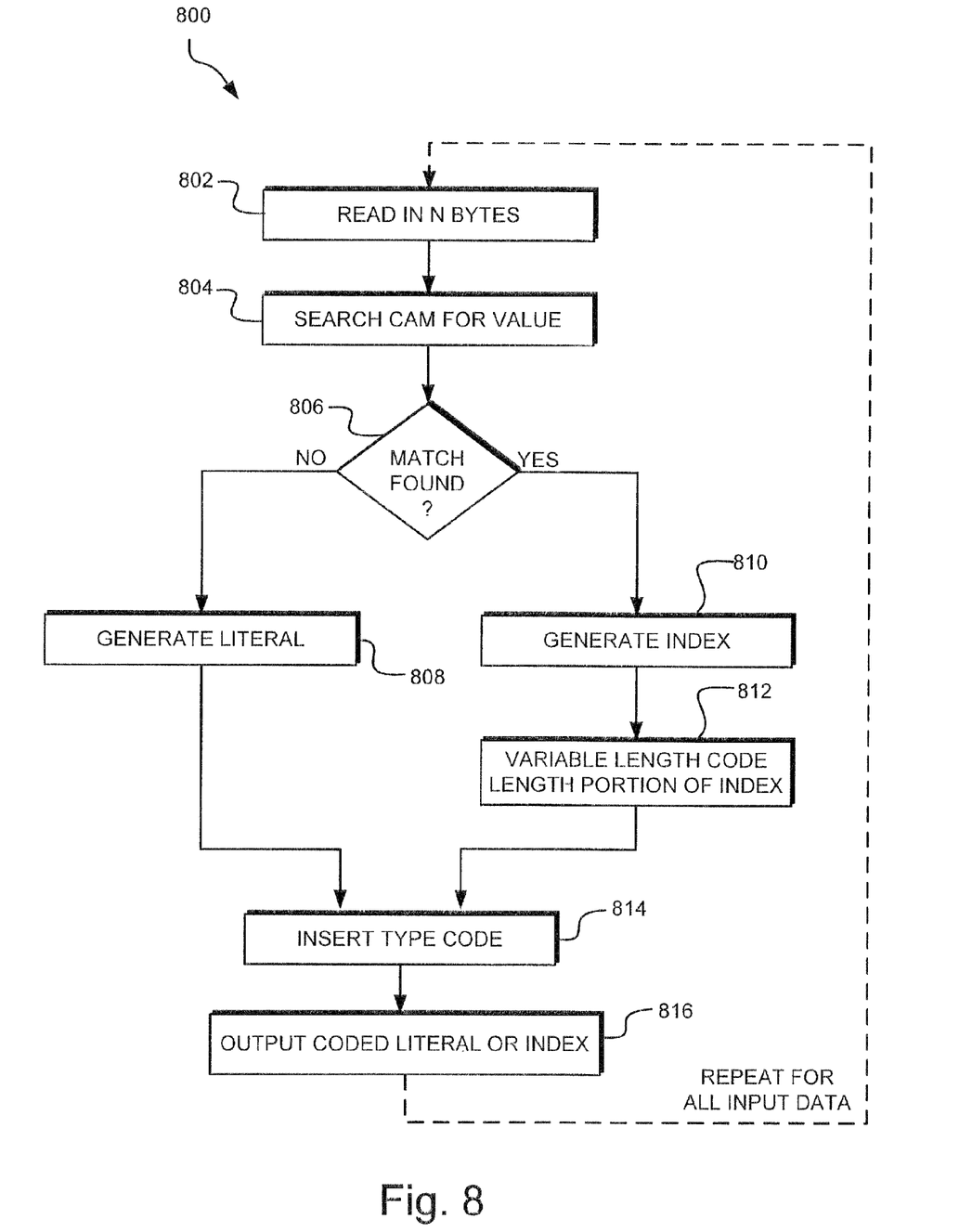

FIG. 8 is a flowchart illustrating a more detailed lossless data compression algorithm 800 that may be used in accordance with various embodiments. A reading operation 802 reads in a predetermined number of bytes. The number of bytes that is read in can vary, depending on the implementation and may be selected to achieve one or more design criteria.

One embodiment utilizes a dual-mode history buffer. The dual-mode history buffer embodiment can operate in an 8-bit mode or a 32-bit mode, wherein 8-bit history buffer comparisons and 32 bit history buffer comparisons, respectively, are employed. For example, running at 200 MHz in 32-bit mode has been found to provide bandwidth of 800 MB/sec and a compression ration of approximately 21%. At 200 MHz in 8-bit mode, the bandwidth is 200 MB/sec but the compression ratio was found to increase to approximately 36%.

While 8-bit mode was found to offer a higher possible compression ratio, 8-bit mode was found to have worse possible downside (negative, or expansive) compression ratio. For example, in 8-bit mode, with an operating frequency of 200 MHz, the worst case compression ratio was −12.5%, while 32-bit mode had a worst case compression ratio of −3.125%.

In searching operation 804, the N bytes that were read in are searched for in the content addressable memory (CAM). A query operation 806 determines whether a match is found in the CAM. If a match is not found, the algorithm branches "NO" to a generating operation 808 that generates a literal from the N input bytes. If a match is found at query operation 806, the algorithm braches "YES" to generating operation 810 that generates an index composed of a pointer and a length portion. A variable length coding operation 812 variable length codes the length portion of the index. In one embodiment, Elias Delta codes are used in the variable length coding operation 812 as described in other parts of this specification.

Inserting operation 814 inserts a type code specifying whether the encoded output is an index or a literal. Outputting operation 816 outputs the tokenized encoded data. In one embodiment, outputting operation 816 generates control codes including literal control codes and index control codes, wherein index control codes have a pointer portion and a variable length coded length portion. The pointer portion refers to a location in the CAM 502 of where the string match started and the length portion indicates how many symbols are to be copied from the location.

Referring again to query operation 806, in an alternative embodiment, speculative string matching is used, rather than automatically generating a literal when the N bytes do not match a string in the history buffer. If a first number of the N bytes match a string in the history buffer, but a subsequent byte or bytes in the N bytes does not continue matching the string but does match another CAM 502 location, the subsequent byte(s) is treated as the beginning of another possible matching string. The subsequent byte and later bytes are searched for in the history buffer, and if a match is found, an index control code is created, rather than a literal. In other words, if a byte that is read in does not continue a string match with respect to the history buffer but does match another location in the CAM 502, it is assumed that the byte may be the start of another matching string in the history buffer. If so, further compression is achieved by attempting to create another index control code, rather than outputting a literal control code.

The above specification, examples and data provide a complete description of the structures of exemplary implementations of apparatus that may be used for losslessly compressing data. Although various implementations of the apparatus have been described above with a certain degree of particularity, or with reference to one or more individual implementations, those skilled in the art could make numerous alterations to the disclosed implementations without departing from the spirit or scope of this invention. It is intended that all matter contained in the above description and shown in the accompanying drawings shall be interpreted as illustrative only of particular implementations and not limiting. Changes in detail or structure may be made without departing from the basic elements of the invention as defined in the following claims.

What is claimed is:

1. A method comprising:
variable length coding one or more values of control codes generated from dictionary coding data, wherein variable length coding the one or more values of control code comprises variable length coding a length value of the control code;
wherein dictionary coding the data comprises:
reading in a specified number of symbols;
determining if the symbols match a prior received set of data; and
if the symbols match a prior received set of data, substituting a pointer and a length value for the symbols, wherein the pointer refers to a location of the prior received set of data and the length value indicates a length of matching data.

2. The method of claim 1, further comprising dictionary coding the data to generate the control codes.

3. The method of claim 2, wherein dictionary coding the data further comprises applying a Lempel-Ziv 77 (LZ77) algorithm to the data.

4. The method of claim 1, further comprising inserting a type code to the control codes, wherein the type code indicates whether the control code is a literal or an index.

5. The method of claim 1, wherein variable length coding comprises substituting Elias Delta codes for length values of the control codes.

6. The method of claim 1, wherein the control codes comprise literals and indices, wherein each index comprises a length value and a pointer to a location of a prior received set of data.

7. A system comprising:
a modeler operable to determine whether a set of input data matches prior input data wherein the modeler comprises:
a content addressable memory receiving current input data; and
a running string memory comprising prior input data, wherein the current input data of the CAM is compared to the prior input data of the running string memory; and
an encoder operable to generate control codes including one or more literal control codes and one or more index control codes, wherein each index control code includes a pointer to a location in the input data and a length value indicating a number of bytes to copy from the location, and wherein the length value is variable length coded.

8. The system of claim 7, wherein the modeler further comprises AND modules in operable communication with memory locations of the CAM and the running string memory, wherein the AND modules provide comparison between memory locations of the CAM and the running string memory.

9. The system of claim 7, wherein the encoder variable length codes the length values using Elias Delta codes.

10. The system of claim 7, further comprising a match counter operable to generate a matching string length.

11. A storage device comprising:
a data compression system configured to dictionary code data to generate control codes comprising literal control codes and index control codes, wherein each index control code comprises a length value and a pointer, and wherein the data compression system is further configured to variable length code the length values of the index control codes;
wherein dictionary coding the data comprises:
reading in a specified number of symbols;
determining if the symbols match a prior received set of data; and
if the symbols match a prior received set of data, substituting a pointer and a length value for the symbols, wherein the pointer refers to a location of the prior received set of data and the length value indicates a length of matching data.

12. The storage device of claim 11 wherein the data compression system comprises:
a modeler configured to compare current input data to previous input data;
an encoder configured to generate the control codes, wherein the encoder generates an index control code when a string of current input matches a string of previous input data, and wherein the encoder variable length codes length values of the index control codes.

13. The storage device of claim 12, wherein the data compression system further comprises a match counter generating the length values when a matching string is detected.

14. A method comprising:
variable length coding one or more values of control codes generated from dictionary coding data, wherein the control codes comprise literals and indices; and
wherein dictionary coding the data comprises:
reading in a specified number of symbols;
determining if the symbols match a prior received set of data; and
if the symbols match a prior received set of data, substituting a pointer and a length value for the symbols, wherein the pointer refers to a location of the prior received set of data and the length value indicates a length of matching data.

15. The method of claim 14, further comprising speculatively string matching the symbols.

16. The method of claim 15, wherein speculatively string matching comprises:
determining that an input symbol from among the read in symbols does not continue a current string match with respect to the prior received data;
determining that at least the input symbol from among the read in symbols matches at least one other value in the prior received data; and
continuing string matching with the next read in symbol.

17. A storage device comprising:
a data compression system configured to dictionary code data to generate control codes comprising literal control codes and index control codes, wherein each index control code comprises a length value and a pointer, and wherein the data compression system is further configured to variable length code the length values of the index control codes, wherein variable length coding one or more values of a control code comprises variable length coding the length value of the control code.

18. The method of claim 17, wherein dictionary coding the data comprises:
reading in a specified number of symbols;
determining if the symbols match a prior received set of data; and
if the symbols match the prior received set of data, substituting a pointer and a length value for the symbols, wherein the pointer refers to a location of the prior received set of data and the length value indicates a length of matching data.

19. A method comprising:
variable length coding one or more values of control codes generated from dictionary coding data, wherein the control codes comprise literals and indices, wherein each index comprises a length value and a pointer to a location of a prior received set of data; and
inserting a type code to the control codes, wherein the type code indicates whether the control code is a literal or an index.

* * * * *